United States Patent
Wallace, Jr. et al.

(10) Patent No.: US 6,806,729 B2
(45) Date of Patent: Oct. 19, 2004

(54) GROUND BOUNCE DETECTION CIRCUIT FOR USE IN DATA ERROR REDUCTION

(75) Inventors: Douglas Elmer Wallace, Jr., Austin, TX (US); James Bryce Mobley, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 487 days.

(21) Appl. No.: 09/766,204

(22) Filed: Jan. 19, 2001

(65) Prior Publication Data

US 2002/0097067 A1 Jul. 25, 2002

(51) Int. Cl.$^7$ ............................................. H03K 19/003
(52) U.S. Cl. ........................................ 326/33; 326/27
(58) Field of Search ...................... 326/30–34, 26–27; 327/379, 384

(56) References Cited

U.S. PATENT DOCUMENTS

| | | | | | |
|---|---|---|---|---|---|
| 4,901,036 | A | * | 2/1990 | Herold et al. | 331/25 |
| 5,049,763 | A | * | 9/1991 | Rogers | 326/33 |
| 5,604,453 | A | * | 2/1997 | Pedersen | 327/112 |
| 6,154,059 | A | * | 11/2000 | Cheung et al. | 326/83 |

* cited by examiner

*Primary Examiner*—James H Cho
(74) *Attorney, Agent, or Firm*—Haynes and Boone, LLP

(57) ABSTRACT

A circuit for detecting ground bounce and for using the detection information to reduce data error resulting therefrom is described. In one embodiment an on-chip ground bounce detector circuit detects large ground bounce events caused by the simultaneous switching of I/O buffers of the chip and notifies an on-chip logic circuit of the event The on-chip logic circuit can be implemented to take a variety of actions upon receipt of notification from the detection circuit that a ground bounce has been detected.

15 Claims, 2 Drawing Sheets

GROUND BOUNCE DETECTION CIRCUIT FOR USE IN DATA ERROR REDUCTION

BACKGROUND

The disclosures herein relate generally to ground bounce caused by simultaneous switching of I/O buffers in complex integrated circuits and, more particularly, to a circuit for detecting ground bounce and for reducing data error resulting therefrom.

Simultaneous switching of I/O buffers in complex integrated circuits create sudden shifts in the ground and power plane voltages. These shifts, generically referred to as "ground bounce," cause relative shifts in the output buffers' signals to the extent that a "0" can be detected as a "1" and vice versa, causing data errors. This problem is becoming increasingly troublesome due to lowered signal voltage levels and their consequent lower noise margins and the increase in density of I/O in increasingly complex chips. The worst ground bounce scenarios occur when most or all I/O buffers drive their output simultaneously.

Prior methods of addressing the above-described problem include adjusting the slew rate of individual I/O buffers, increasing the interplane capacitance using on-chip capacitors, and increasing the decoupling in the immediate region of the transmitting chip. These prior art solutions suggest the use of long phase delay periods on the order of the ground bounce resonance period, but do not include phase de-skewing and are therefore not exceedingly practical without a major revision of bus timing and protocol. They also fail to provide means for detecting ground bounce and for reducing data error.

Therefore, what is needed is a circuit for detecting ground bounce and for reducing data error resulting therefrom.

SUMMARY

One embodiment, accordingly, is a circuit for detecting ground bounce and for using this information to reduce data error resulting therefrom. In particular, an on-chip ground bounce detector circuit detects large ground bounce events caused by the simultaneous switching of I/O buffers of the chip and notifies an on-chip logic circuit of the event in one embodiment, the on-chip logic circuit is implemented as a memory interface controller. In this embodiment, the on-chip logic circuit detects a possible ground bounce corrupted write operation to a specific address, issues a special rewrite cycle to that address, and holds the rewritten data valid for one additional clock period to allow the possibly corrupted data to settle prior to its being written, thus ensuring its proper reception at the receiving device.

In another embodiment, the on-chip logic circuit is implemented as a set of counters or shift registers for detecting the number of ground bounce events within a given burst cycle and potentially combining them with their respective addresses and/or data patterns. In this manner, more than one event that may occur during a potentially uninterruptable burst cycle may be detected and an identification may be made as to which of potentially multiple data words need to be corrected.

A principal advantage of the embodiment is that it detects ground bounce events and takes action based on such detection to reduce data error resulting therefrom.

DETAILED DESCRIPTION

Figure 1:
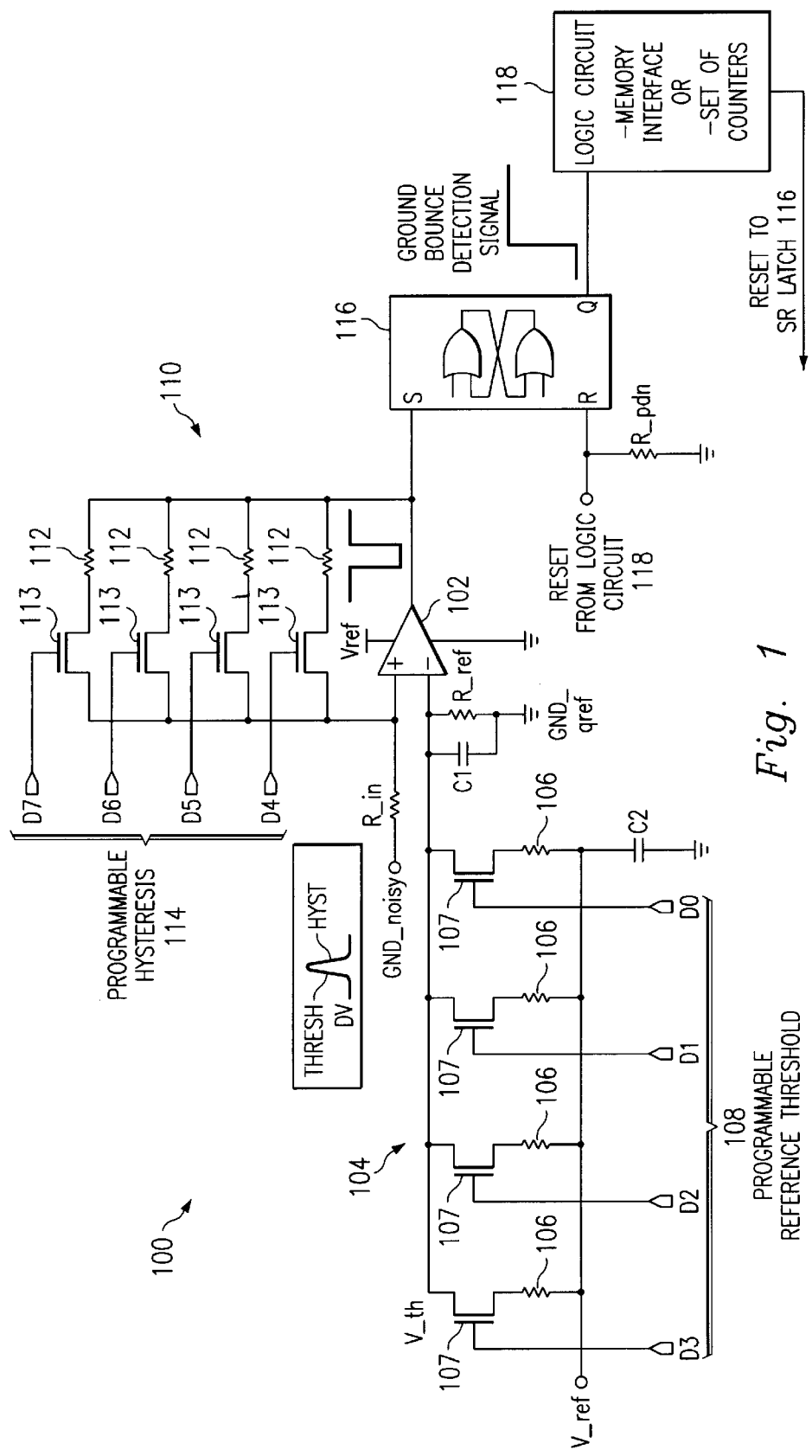
FIG. 1 is a schematic diagram of a ground bounce detection circuit embodying features of one embodiment.

Referring now to FIG. 1, an on-chip ground bounce detection circuit 100 is implemented as a comparator circuit 102 operating as a Schmit trigger that compares the voltage of a noisy switching I/O buffer ground plane of an IC to that of a programmable reference voltage derived from a clean source. A threshold voltage V_th is derived from a first resistor divider network 104 connected to the inverting input of the comparator circuit 102. Half of the divider network 104 is a fixed resistor value R_ref tied to a quiet reference ground GND_qref. The other half of the divider network 104 is a group of n resistors 106 connected in parallel. Each of the resistors 106 can be individually switched in or out of the network 104 via a respective switch 107 and is fled to a dean fixed reference voltage V_ref. The threshold voltage V_th is programmable by writing a binary value corresponding to the desired voltage threshold into a control register 108 that controls the state of the switches 107 and is determined by the overall resistance of the selected resistors 106 in series with the fixed resistor R_ref.

A programmable hysteresis feedback resistor divider network 110 is connected to the non-inverting input of the comparator 102 and functions identically to the first resistor divider network 104, except that a fixed resistor R_in of the network 110 is tied to a noisy switching I/O ring ground GND_noisy. Additionally, a group of n resistors 112 connected in parallel, each of which can be individually switched in or out of the network 110 by a respective switch 113, are connected to the output of the comparator 102. The hysteresis value is programmable by writing a binary value into a control register 114 that controls the state of the switches 113 and is determined by the overall resistance of the selected resistors 112 in series with the fixed resistor R_in. This approach to setting threshold and hysteresis provides for very fine detection granularity, which is limited only by the number of parallel resistors 106, 112, implemented and the resistance values of those resistors.

The output of the comparator 102 is input to a SET input of a cross NOR SR flip flop latch 116. A non-inverting Q output of the latch 116, which is input to an on-chip logic circuit 118, goes to a "HIGH" state when a ground bounce event has been detected. The output of the SR latch 116 will remain in this state until an a logic circuit 118, described in greater detail below, issues a RESET pulse to the SR latch.

The logic circuit 118 can be implemented to take a variety of actions upon receipt of notification from the detection circuit 100 (via the output of the SR latch going HIGH) that a ground bounce has occurred. In one embodiment, the logic circuit 118 is implemented as a memory interface controller. In this embodiment, the logic circuit 118 detects a possible ground bounce corrupted write operation to a specific address, issues a special rewrite cycle to that address, and holds the rewritten data valid for one additional clock period. This allows the possibly corrupted data to settle prior to its being written, thus ensuring its proper reception at the receiving device.

In another embodiment, the logic circuit 118 is implemented as a set of counters or shift registers that detect the number of ground bounce events occurring within a given burst cycle and potentially combine them with their respective addresses and/or data patterns. In this manner, more than one event that may occur during a potentially uninterruptable burst cycle may be detected and an identification may be made as to which of potentially multiple data words need to be corrected.

Figure 2:
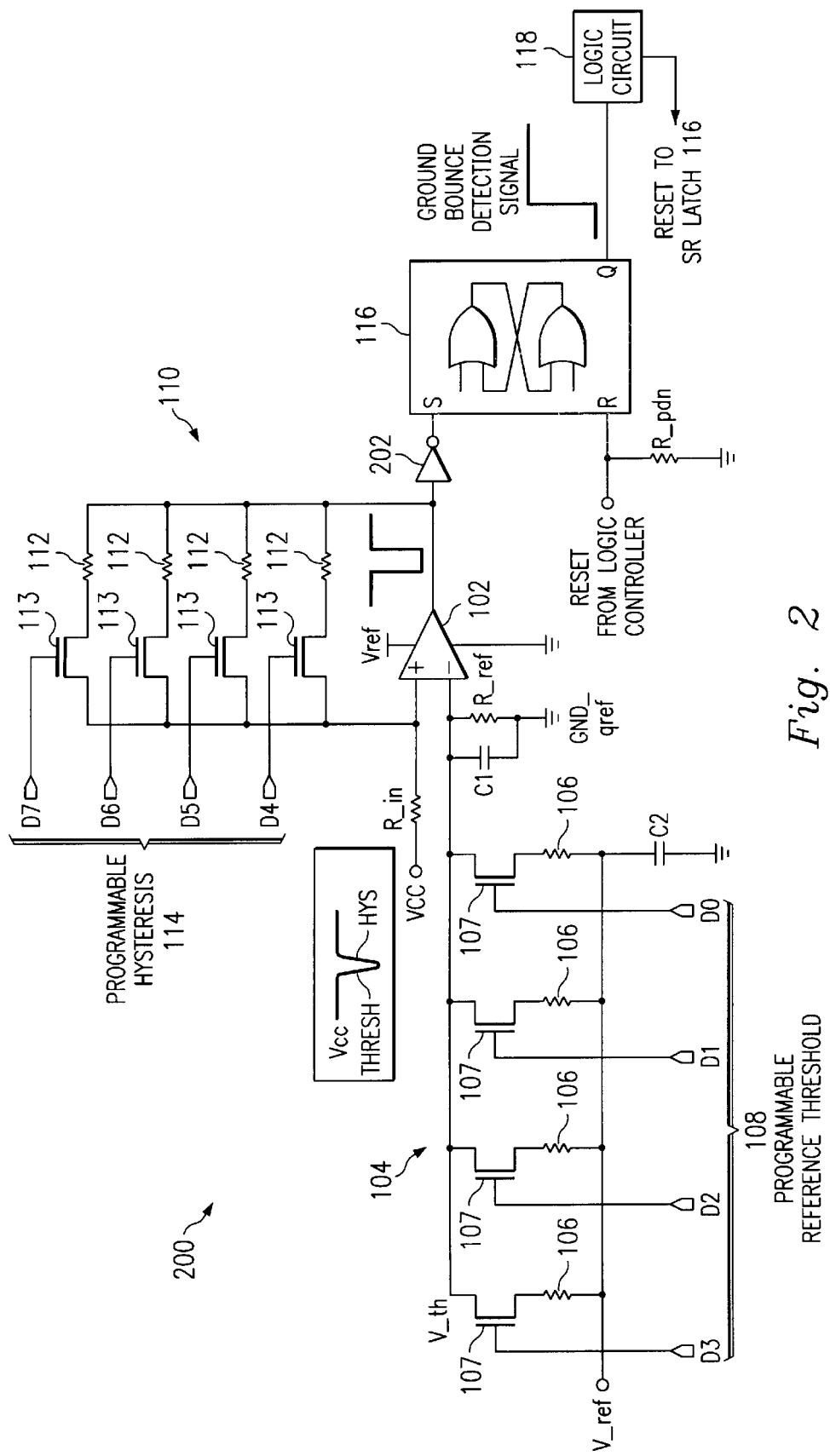
FIG. 2 is a schematic diagram of a power droop detection circuit embodying features of an alternative embodiment.

In an alternative embodiment, with slight modifications, the circuit illustrated in FIG. 1 can also be used to detect "power droop," which is a nearly identical phenomenon to ground bounce only it effects the I/O ring power rail and can have identically detrimental effects on data integrity. Such an alternative embodiment is illustrated in FIG. 2 and designated by a reference numeral 200. Specifically, rather than being tied to GND_noisy, the fixed resistor R_in of the network 110 is tied to Vcc. Additionally, an inverter 202 is added between the output of the comparator 102 and the SET input of the latch 116. The circuit 200 functions in exactly the same fashion as the circuit 100, except that it detects when Vcc drops below a certain threshold V_th, causing the output of the comparator 102 to issue a negative-going pulse rather than a positive pulse. The inverter 202 simply flips the pulse back around for input to the latch 116.

As previously indicated, the on-chip ground bounce detector circuit detects the occasional large ground bounce event caused by the simultaneous switching of a chip's I/O buffers and signals an on-chip logic circuit of the event. The on-chip logic circuit may be implemented to take a variety of actions.

Other possible uses of the embodiments described herein include chip validation to characterize layout, decoupling, and packaging design quality, error reporting to an operating system, system level debugging during prototyping, and diagnostics.

As can be seen, the principal advantage of the embodiments is that they enable the detection of ground bounce events and the use of such information in various manners to reduce data error caused by such ground bounce events.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein

What is claimed is:

1. Apparatus for reducing data error in an integrated circuit ("IC") chip, the apparatus comprising:
   a ground bounce detector circuit for detecting large ground bounce events caused by simultaneous switching of I/O buffers of the IC chip; and
   a logic circuit electrically connected to the ground bounce detector circuit for receiving notification from the ground bounce detector circuit of a large ground bounce event, wherein upon receipt of such notification, the logic circuit takes an action to reduce data error typically caused by such an event.

2. The apparatus of claim 1 wherein the logic circuit comprises a memory interface controller.

3. Apparatus for reducing data error in an integrated circuit ("IC") chip, the apparatus comprising:
   a ground bounce detector circuit for detecting large ground bounce events caused by simultaneous switching of I/O buffers of the IC chip; and
   a memory interface controller circuit electrically connected to the ground bounce detector circuit for receiving notification from the ground bounce detector circuit of a large ground bounce event, wherein upon receipt of such notification, the memory interface controller takes an action designed to reduce data error typically caused by such an event, the memory interface controller detecting a possible ground bounce corrupted write operation to a specific address, issuing]a special rewrite cycle to the specific address, and holding the rewritten data valid for one additional clock period to allow the rewritten data to settle prior to its being written to the specific address.

4. Apparatus for reducing data error in an integrated circuit ("IC") chip, the apparatus comprising:
   a ground bounce detector circuit for detecting large ground bounce events caused by simultaneous switching of I/O buffers of the IC chip; and
   a counter electrically connected to the ground bounce detector circuit for receiving notification from the ground bounce detector circuit of a large ground bounce event, wherein upon receipt of such notification, the counter takes an action designed to reduce data error typically caused by such an event, the counter counting the number of ground bounce events detected by the ground bounce detector circuit within a given burst cycle.

5. The apparatus of claim 4 wherein the counter further associates each detected ground bounce event with its respective address, data pattern, or both.

6. Apparatus for reducing data error in an integrated circuit ("IC") chip, the apparatus comprising:
   means for detecting large ground bounce events caused by simultaneous switching of I/O buffers of the IC chip; and
   means for receiving notification from the ground bounce detector circuit of a large ground bounce event and, responsive to the receiving, for acting to reduce data error typically caused by such an event.

7. The apparatus of claim 6 wherein the means for receiving and acting comprises a logic circuit.

8. Apparatus for reducing data error in an integrated circuit ("IC") chip, the apparatus comprising:
   means for detecting large ground bounce events caused by simultaneous switching of I/O buffers of the IC chip; and
   a logic circuit for receiving notification from the ground bounce detector circuit of a large ground bounce event and, responsive to the receiving, for acting to reduce data error typically caused by such an event, the logic circuit comprising means for detecting a possible ground bounce corrupted write operation to a specific address, issuing a special rewrite cycle to the specific address, and holding the rewritten data valid for one additional clock period to allow the rewritten data to settle prior to its being written.

9. The apparatus of claim 8 wherein the logic circuit includes means for counting the number of ground bounce events detected within a given burst cycle.

10. The apparatus of claim 9 wherein the logic circuit further comprises means for associating each detected ground bounce event with its respective address, data pattern, or both.

11. A method of reducing data error in an integrated circuit ("IC") chip, the method comprising:
    detecting large ground bounce events caused by simultaneous switching of I/O buffers of the IC chip;
    receiving notification of detection of a large ground bounce event; and
    responsive to the receiving, acting to reduce data error typically caused by such an event.

12. The method of claim 11 wherein the receiving and acting are performed by a logic circuit.

13. A method of reducing data error in an integrated circuit ("IC") chip, the method comprising:

detecting large ground bounce events caused by simultaneous switching of I/O buffers of the IC chip;

receiving notification of detection of a large ground bounce event; and responsive to the receiving, acting to reduce data error typically caused by such an event, wherein the receiving and acting are performed by a logic circuit, the logic circuit comprising a memory interface controller and wherein the acting comprises:

detecting a possible ground bounce corrupted write operation to a specific address;

issuing a special rewrite cycle to the specific address; and holding the rewritten data valid for one additional clock period to allow the rewritten data to settle prior to its being written.

14. A method of reducing data error in an integrated circuit ("IC") chip, the method comprising:

detecting large ground bounce events caused by simultaneous switching of I/O buffers of the IC chip;

receiving notification of detection of a large ground bounce event; and responsive to the receiving, acting to reduce data error typically caused by such an event, wherein the receiving and acting are performed by a logic circuit, the logic circuit comprising a counter for counting the number of ground bounce events detected within a given burst cycle.

15. The method of claim 14 wherein the logic circuit further associates each detected ground bounce event with its respective address, data pattern, or both.

* * * * *